(12) United States Patent
Hester et al.

(10) Patent No.: US 7,211,894 B2
(45) Date of Patent: May 1, 2007

(54) CAPACITOR-RELATED SYSTEMS FOR ADDRESSING PACKAGE/MOTHERBOARD RESONANCE

(75) Inventors: Jennifer A. Hester, Litchfield Park, AZ (US); Yuan-Liang Li, Chandler, AZ (US); Michael M. Desmith, Beaverton, OR (US); David G. Figueroa, Mesa, AZ (US); Dong Zhong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 11/103,939

(22) Filed: Apr. 12, 2005

(65) Prior Publication Data

US 2005/0194675 A1 Sep. 8, 2005

Related U.S. Application Data

(62) Division of application No. 10/602,096, filed on Jun. 23, 2003, now Pat. No. 6,992,387.

(51) Int. Cl.
*H01L 23/48* (2006.01)
*H01L 27/108* (2006.01)

(52) U.S. Cl. .................... 257/738; 257/296

(58) Field of Classification Search ............ 257/296, 257/306, 309, 312, 738, 748, 750, 758, 759, 257/308
See application file for complete search history.

(56) References Cited

U.S. PATENT DOCUMENTS

| | | | |
|---|---|---|---|
| 4,947,286 A | 8/1990 | Kaneko et al. | |
| 5,583,738 A | 12/1996 | Kohno et al. | |
| 5,880,925 A | 3/1999 | DuPré et al. | |
| 5,929,627 A | 7/1999 | MacPherson et al. | |
| 6,037,621 A | * | 3/2000 | Wilson ............... 257/296 |
| 6,188,565 B1 | 2/2001 | Naito et al. | |

(Continued)

FOREIGN PATENT DOCUMENTS

DE 39 42 509 A1 6/1991

(Continued)

OTHER PUBLICATIONS

"European Search Report of the European Patent Office", mailed Jul. 26, 2006, for EP 04754645.2, 4pgs.

*Primary Examiner*—Howard Weiss
*Assistant Examiner*—Hoa (Vikki) B. Trinh
(74) *Attorney, Agent, or Firm*—Buckley, Maschoff & Talwalkar LLC

(57) ABSTRACT

According to some embodiments, a device includes a first conductive plane electrically coupled to a first terminal associated with a first polarity and a second terminal associated with the first polarity, a second conductive plane electrically coupled to a third terminal associated with a second polarity, a dielectric disposed between the first conductive plane and the second conductive plane, a third conductive plane electrically coupled to the second terminal and not electrically coupled to the first terminal, and a second dielectric disposed between the second conductive plane and the third conductive plane. A first capacitance is present between the first terminal and the third terminal, a second capacitance is present between the second terminal and the third terminal, and the first capacitance and the second capacitance may be substantially dissimilar.

17 Claims, 15 Drawing Sheets

U.S. PATENT DOCUMENTS

| | | |
|---|---|---|
| 6,344,961 B1 | 2/2002 | Naito et al. |
| 6,369,443 B1 | 4/2002 | Baba |
| 6,762,498 B1 | 7/2004 | Morrison et al. |
| 6,803,659 B2 | 10/2004 | Suwa et al. |
| 6,981,162 B2 * | 12/2005 | Chang et al. ............... 713/310 |
| 2002/0041006 A1 | 4/2002 | Ahiko et al. |
| 2002/0171997 A1 | 11/2002 | Togashi et al. |
| 2003/0034855 A1 | 2/2003 | Wallace, Jr. et al. |
| 2003/0102502 A1 | 6/2003 | Togashi |

FOREIGN PATENT DOCUMENTS

| | | |
|---|---|---|
| EP | 0 506 122 A2 | 9/1992 |
| EP | 0 506 122 A3 | 9/1992 |
| JP | 2000 021676 A | 1/2000 |
| JP | 2002 151349 A | 5/2002 |
| WO | WO 02/052614 A1 | 7/2002 |

* cited by examiner

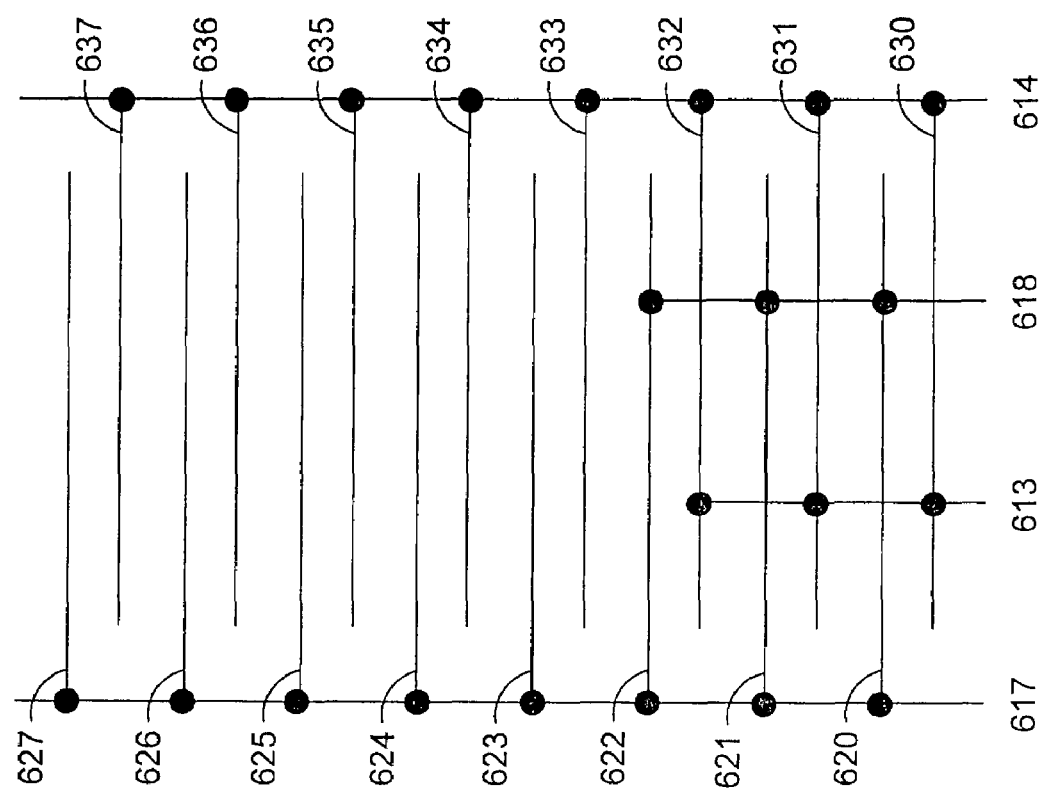
FIG. 5B
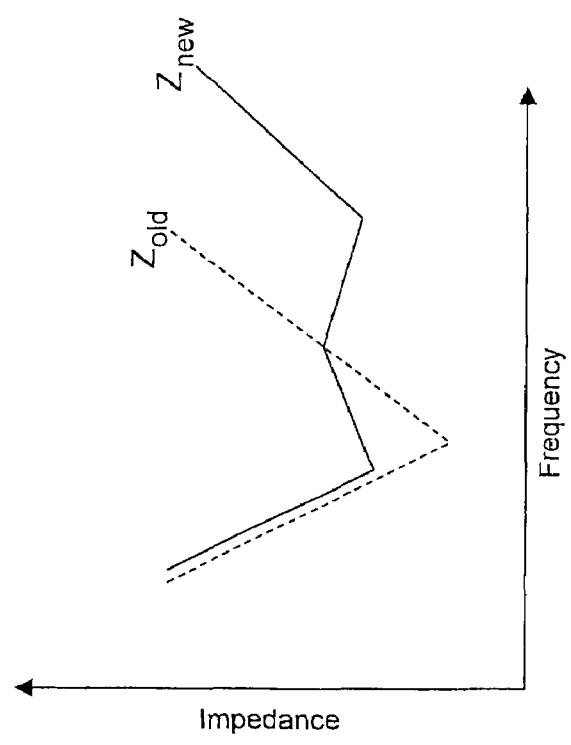
FIG. 5A
FIG. 5C

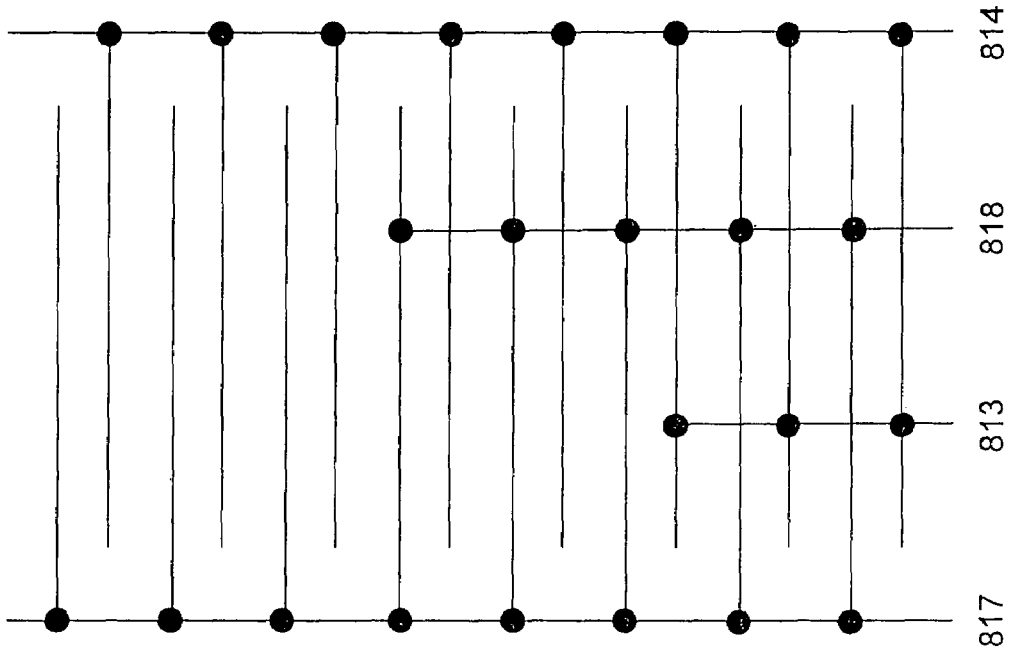
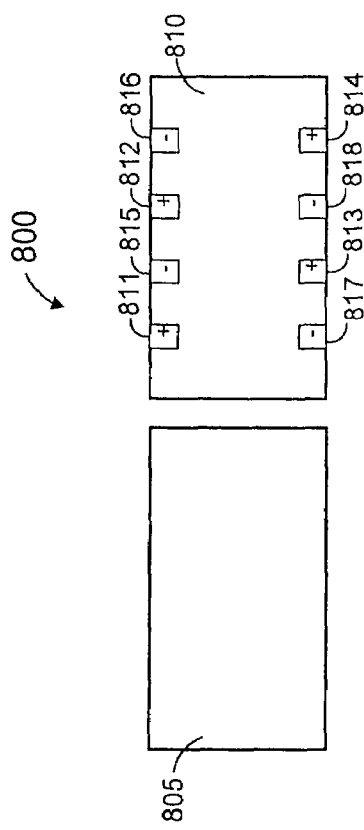
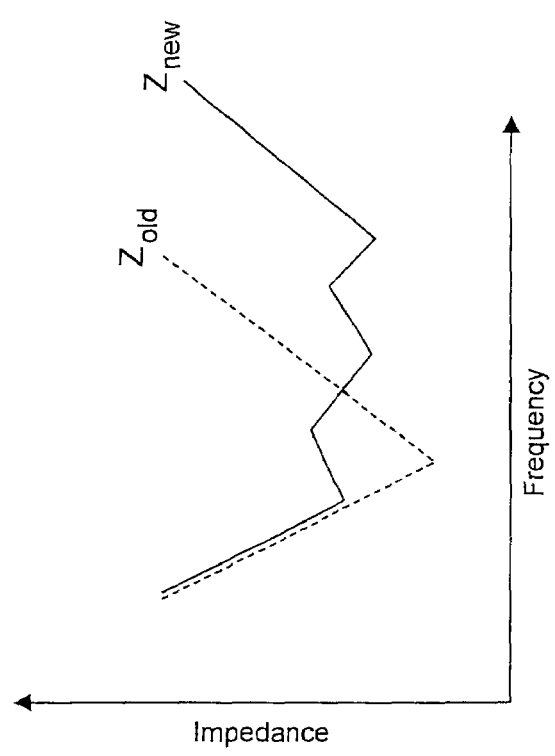
FIG. 7B
FIG. 7A
FIG. 7C

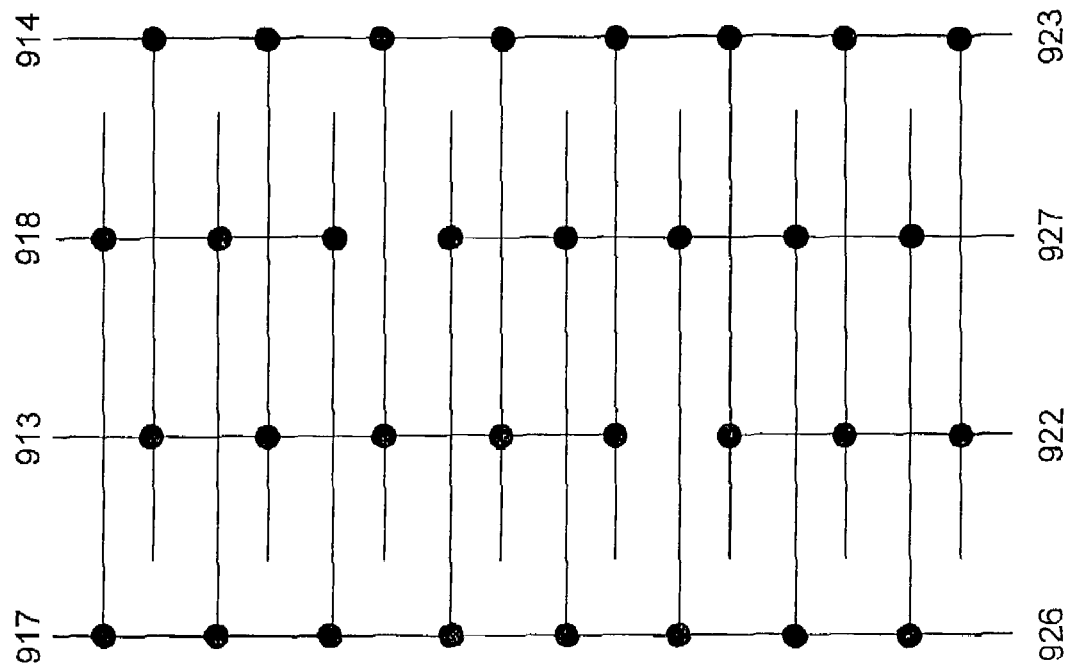
FIG. 8A
FIG. 8B
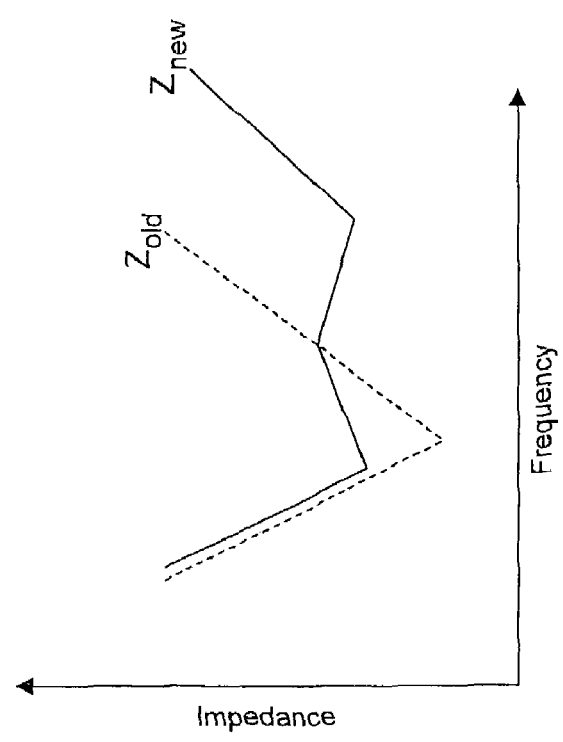
FIG. 8C

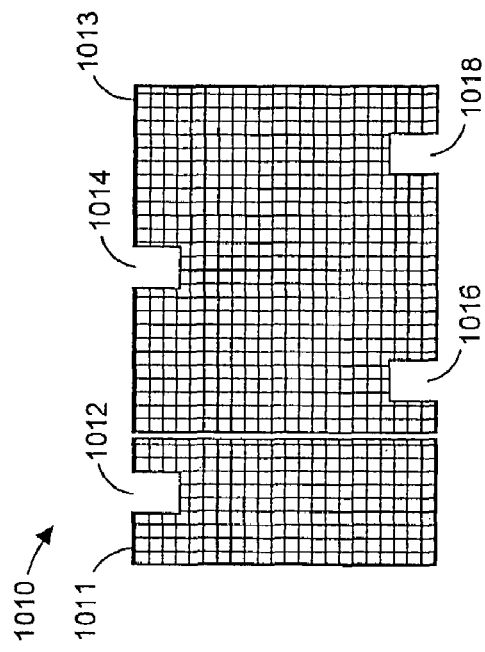
FIG. 9B
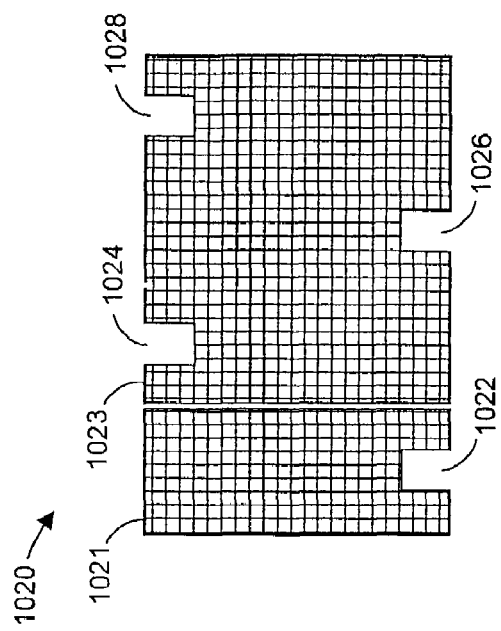
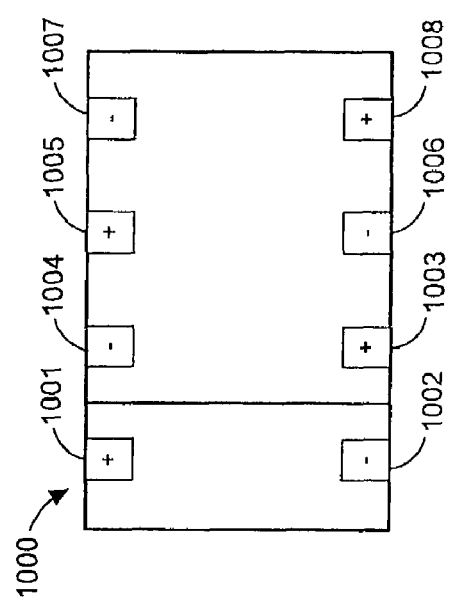
FIG. 9A
FIG. 9C

CAPACITOR-RELATED SYSTEMS FOR ADDRESSING PACKAGE/MOTHERBOARD RESONANCE

CROSS-REFERENCE TO RELATED APPLICATION

This is a divisional of prior U.S. patent application Ser. No. 10/602,096, filed Jun. 23, 2003 now U.S. Pat. No. 6,992,387.

BACKGROUND

Integrated circuit packages provide physical protection to an integrated circuit. Packages may also provide thermal and electrical management to the integrated circuit. More specifically, an integrated circuit package may dissipate heat generated by an integrated circuit and electrically connect the integrated circuit to external circuitry. In the latter regard, a conventional package may provide power and ground planes as well as integrated capacitors for distributing and routing electrical signals between an integrated circuit and a motherboard. The transmission of these signals often results in unwanted resonance between the motherboard and the package, which negatively affects the performance of the integrated circuit.

BRIEF DESCRIPTION OF THE DRAWINGS

FIG. 5A includes a representation of an upper surface and terminals extending from a lower surface of a device according to some embodiments.

FIG. 5B illustrates connections between terminals and conductive planes of the FIG. 5A device according to some embodiments.

FIG. 5C is a graphical comparison of impedance profiles for the FIG. 5A device and for a conventional device according to some embodiments.

FIG. 7A includes a representation of an upper surface and terminals extending from a lower surface of a device according to some embodiments.

FIG. 7B illustrates connections between terminals and conductive planes of the FIG. 7A device according to some embodiments.

FIG. 7C is a graphical comparison of impedance profiles for the FIG. 7A device and for a conventional device according to some embodiments.

FIG. 8A includes a representation of terminals extending from an upper surface and terminals extending from a lower surface of a device according to some embodiments.

FIG. 8B illustrates connections between terminals and conductive planes of the FIG. 8A device according to some embodiments.

FIG. 8C is a graphical comparison of impedance profiles for the FIG. 8A device and for a conventional device according to some embodiments.

FIG. 9A includes a representation of terminals extending from a surface of a device according to some embodiments.

FIG. 9B illustrates conductive planes of the FIG. 9A device according to some embodiments.

FIG. 9C is a graphical comparison of impedance profiles for the FIG. 9A device and for a conventional device according to some embodiments.

DETAILED DESCRIPTION

Figure 1:
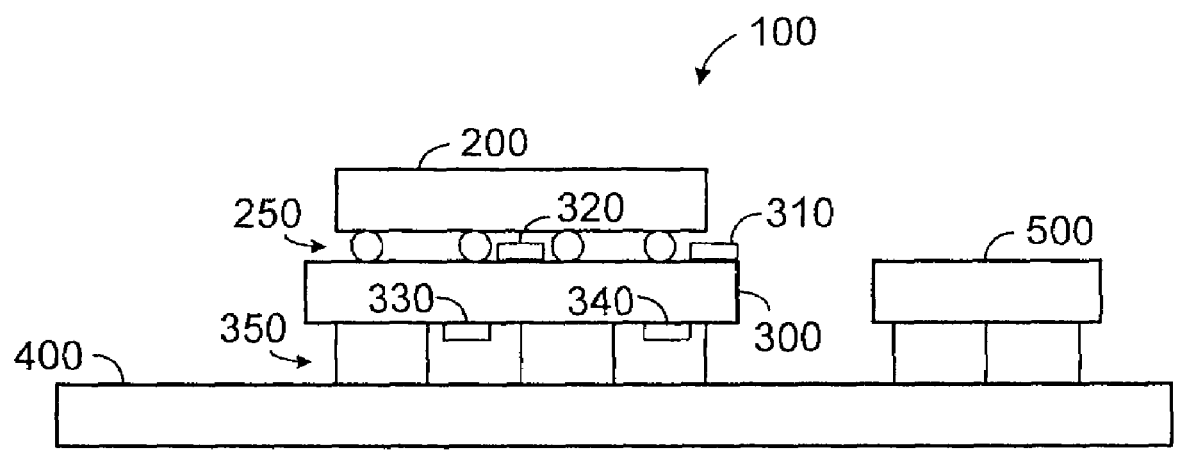
FIG. 1 is a side elevation of a system according to some embodiments.

FIG. 1 is a side elevation of system 100 according to some embodiments. System 100 includes integrated circuit 200, package 300, motherboard 400 and memory 500. Integrated circuit 200 may be fabricated using any suitable substrate material and fabrication technique and may provide any functions to system 100. In some embodiments, integrated circuit 200 is a microprocessor chip having a silicon substrate.

Package 300 may comprise any ceramic, organic, and/or other suitable material. Package 300 is electrically coupled to circuit 200 by Controlled Collapse Chip Connect (C4) solder bumps 250. Package 300 therefore comprises an interface compatible with C4 solder bumps 250. In some embodiments, package 300 is electrically coupled to circuit 200 via wirebonds. Capacitors 310 through 340 are mounted on package 300. Terminals of capacitors 310 through 340 may be mounted using surface mount techniques on power and ground pads of package 300. Power and ground pads according to some embodiments will be described in detail below.

Pins 350 couple package 300 to motherboard 400. In this regard, package 300 and pins 350 may comprise a flip-chip pin grid array to interface with a socket (not shown) of motherboard 400. According to some embodiments, package 300 is a surface-mountable substrate such as an Organic Land Grid Array substrate that may be mounted directly on motherboard 400 or mounted on a pinned interposer which mates with a socket of motherboard 400. Packaging systems other than those mentioned above may be used in conjunction with some embodiments.

Integrated circuit 200 may communicate with memory 500 through package 300 and motherboard 400. Memory 500 may comprise any type of memory for storing data, such as a Single Data Rate Random Access Memory, a Double Data Rate Random Access Memory, or a Programmable Read Only Memory.

Figure 2:
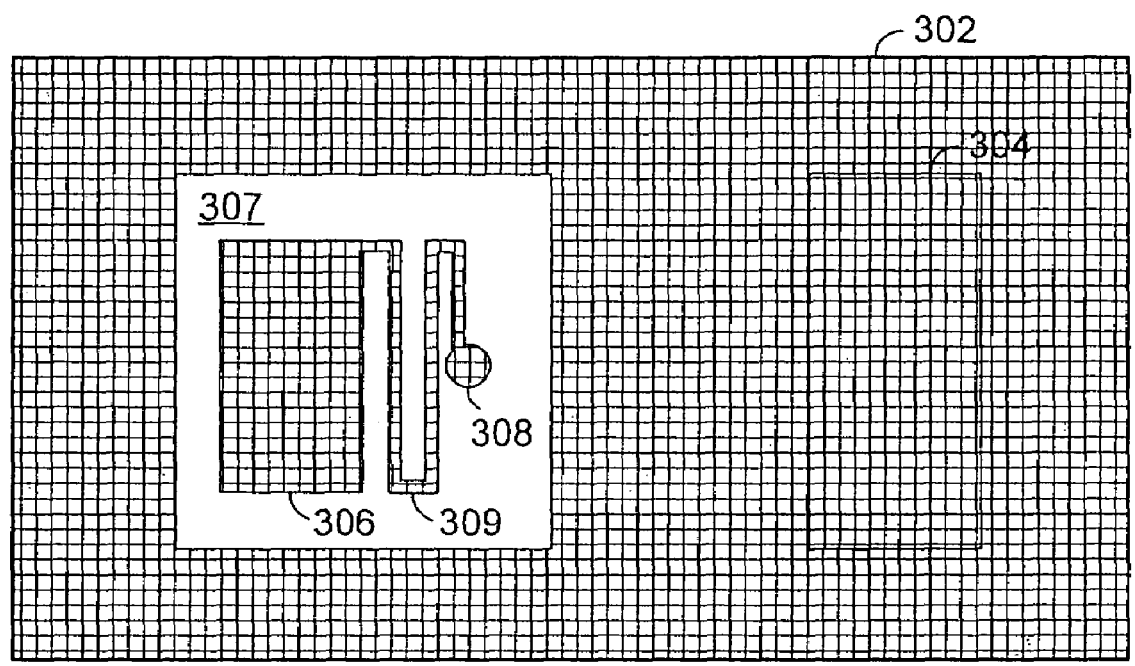
FIG. 2 is a top view of a capacitor pad design according to some embodiments.

FIG. 2 is a top view of a capacitor pad design according to some embodiments. FIG. 2 shows power plane 302 of package 300. Power plane 302 may be designed to carry a supply voltage to circuit 200. Accordingly, any of C4 balls 250 may connect to power plane 302 to receive the supply voltage.

Power plane 302 includes power pad 304. Power pad 304 may receive a terminal of a circuit element such as a capacitor. Power pad 304 may simply comprise a region of power plane 302 and/or may comprise material that is built up on the region to facilitate reception of the terminal.

Ground pad 306 may receive a second terminal of the circuit element. As will be described below, ground pad 306 is electrically coupled to a ground plane of package 300. Accordingly, ground pad 306 may be surrounded by non-conducting region 307 to avoid short-circuiting the ground plane with power plane 302. Ground pad 306 is electrically coupled to a ground plane of package 300 through via area 308. Via area 308 is substantially coplanar with ground pad 306 and is electrically coupled to ground pad 306 by trace 309. Via area 308 is separated from ground pad 306 in that via area is not to receive a terminal of the circuit element.

Figure 3:
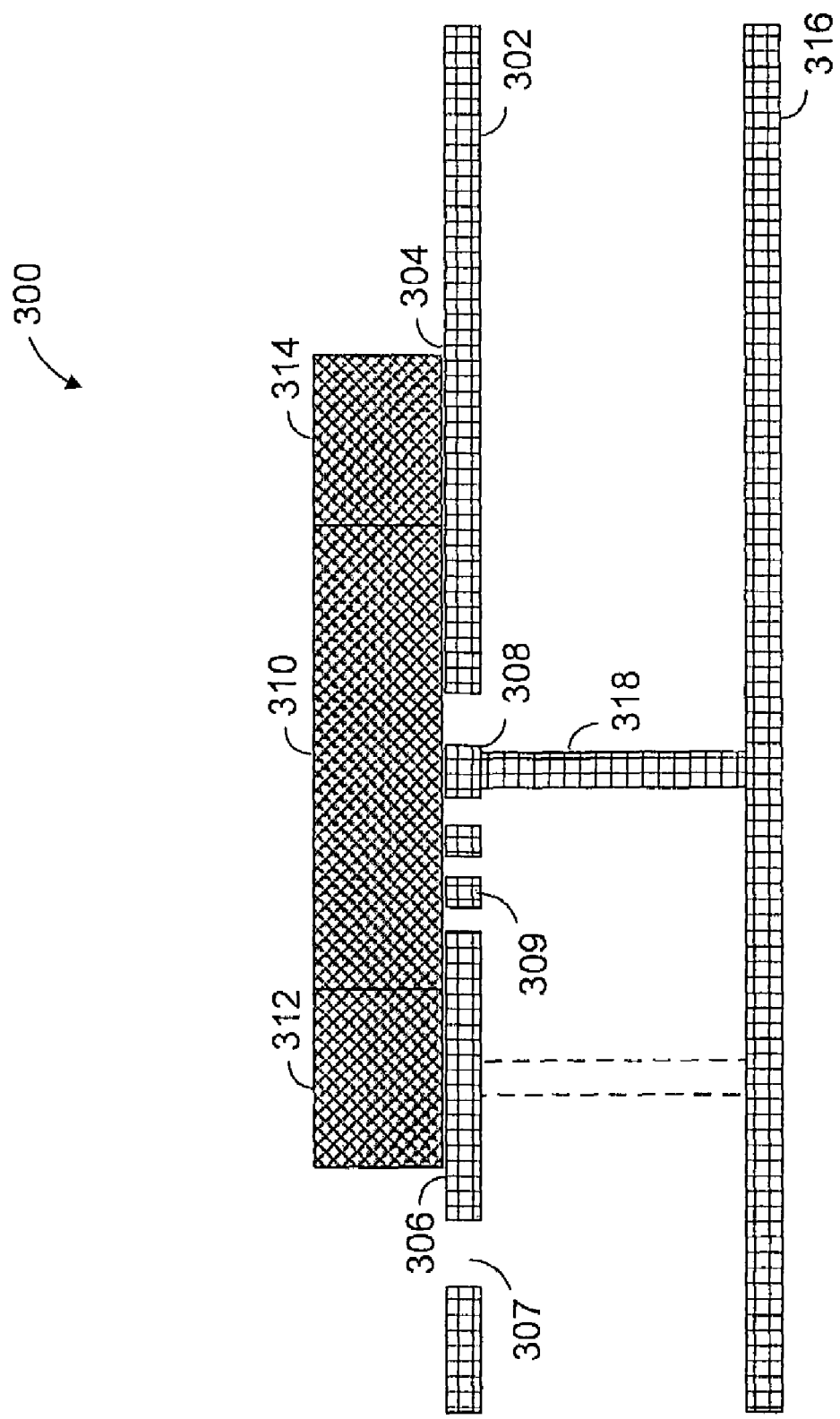
FIG. 3 is a side cutaway view of a package including a capacitor pad design according to some embodiments.

FIG. 3 shows a side cutaway view of package 300 and capacitor 310 according to some embodiments. FIG. 3 shows power plane 302, power pad 304, ground pad 306, and non-conducting region 307 of FIG. 2. Also shown are terminals 312 and 314 of capacitor 310 coupled to ground pad 306 and power pad 304, respectively. Ground plane 316 may provide circuit 200 with a path to ground and is coupled to via area 308 by via 318.

In operation, current flows consecutively through power plane 302, power pad 306, terminal 314, terminal 312, ground pad 306, trace 309, via area 308, via 318, and ground plane 316. Conventional systems do not include trace 309 or via area 308. Rather, via 318 may be located at the location shown in FIG. 3 by a dotted line. The longer current path may cause the equivalent series resistance of capacitor 310 to be greater than that of conventional systems. Accordingly, some embodiments may provide an efficient system to reduce resonance between package 300 and motherboard 400 by increasing an equivalent series resistance of package capacitors.

Figure 4:
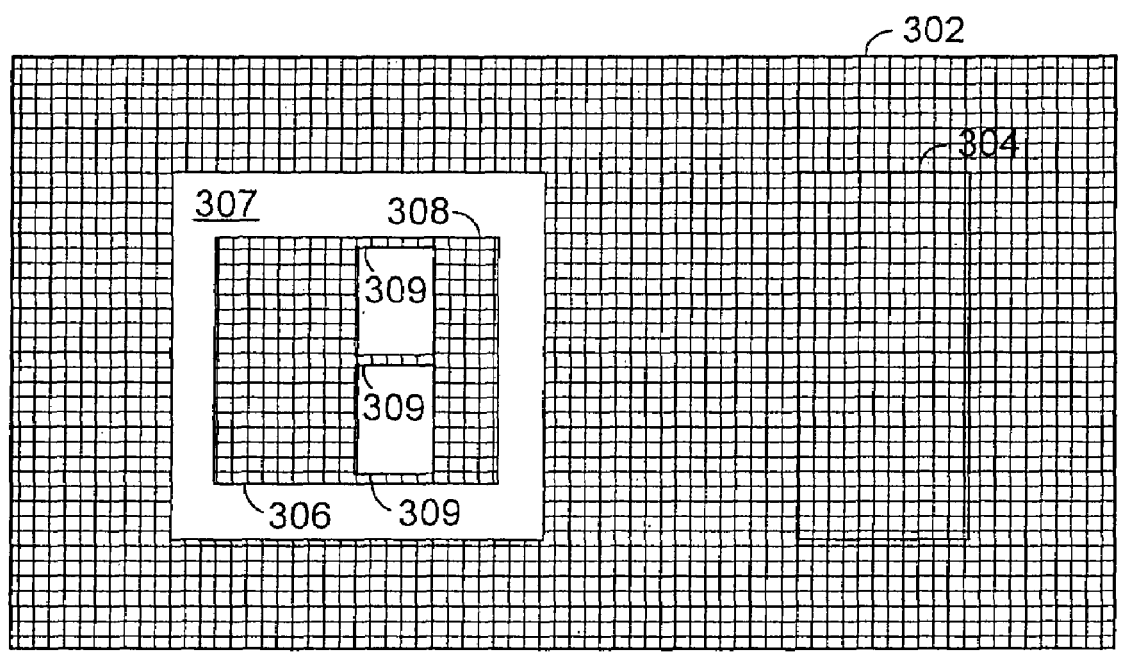
FIG. 4 is a top view of a capacitor pad design according to some embodiments.

FIG. 4 illustrates a second capacitor pad design according to some embodiments. The design includes power plane 302, which includes power pad 304 to receive a terminal of a circuit element. Also included are ground pad 306 to receive a second terminal of the circuit element and via area 308. Via area 308 of FIG. 4 is substantially coplanar with ground pad 306, is separated from ground pad 306, and is electrically coupled to ground pad 306 by trace 309. The FIG. 4 design also comprises a via (not shown to electrically couple via area 308 to a ground plane (not shown).

FIG. 5A includes representations of a device according to some embodiments. Shown in FIG. 5 are two representations of device 600. Device 600 may comprise one or more individual capacitors according to some embodiments. Any of capacitors 310 through 340 may comprise device 600 according to some embodiments. In this regard, any of the devices described below may be disposed on package 300 similarly to capacitors 310 through 340.

As shown, upper surface 605 of device 600 consists of the material of which device 600 is composed. This material may be ceramic, organic, plastic and/or any other suitable material. Lower surface 610 of device 600 includes the aforementioned material as well as terminals 611 through 618. Terminals 611 through 618 may comprise pins, surface mount terminals, or any other type of device terminal. Terminals 611 through 614 are associated with a first polarity (positive), while terminals 615 through 618 are associated with a second polarity (negative).

FIG. 5B is a side cutaway representation of device 600 according to some embodiments. The representation shows terminals 617, 613, 618 and 614, each of which is coupled to several conductive planes. In particular, terminal 617 is coupled to each of conductive planes 620 through 627 and terminal 618 is coupled to conductive planes 620 through 622. Conductive planes 620 through 627 are therefore associated with the same polarity (negative) as are terminals 617 and 618. Terminal 614 is coupled to each of conductive planes 630 through 637 and terminal 613 is coupled to conductive planes 630 through 632. As above, conductive planes 630 through 637 are associated with the same polarity (positive) as are terminals 613 and 614.

Each of the conductive planes 630 through 637 is separated from at least one of conductive planes 620 through 627 by a dielectric material. Accordingly, a capacitance is present between two terminals of device 600 that are associated with different polarities. For example, a first capacitance is present between terminal 617 and 613. A second capacitance is also present between terminals 618 and 614. According to some embodiments, a sum of the first capacitance and the second capacitance is substantially equal to the capacitance between terminals 617 and 614.

FIG. 5C is a graphical comparison of impedance profiles for device 600 and for a conventional device according to some embodiments. In a conventional device, each terminal that is associated with a given polarity is connected to all planes of the device that are also associated with the given polarity. As a result, a same capacitance is present between any two terminals of opposite polarity.

FIG. 5C illustrates that embodiments may provide a more uniform impedance profile than a conventional device by connecting the first and the second capacitances of device 600 in parallel. The existence of fewer terminals for each capacitance also may increase the equivalent series resistance of the total capacitance. Each of these factors may reduce resonance between a motherboard and a package on which device 600 is mounted.

Figure 6B:
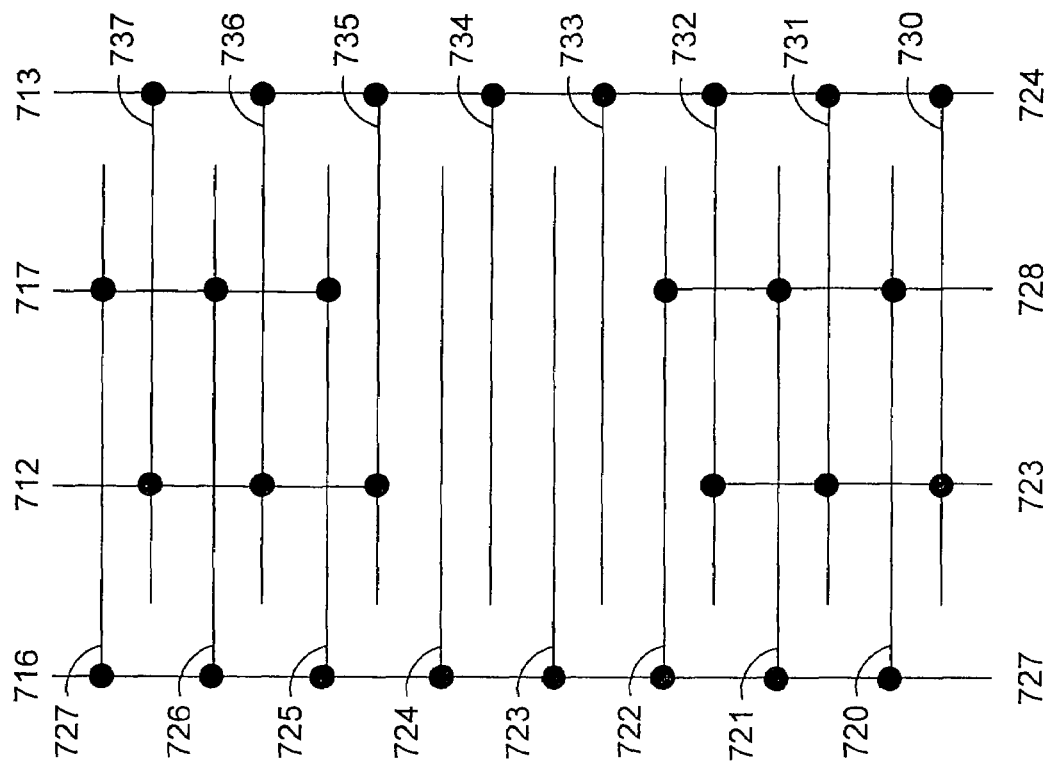
FIG. 6B illustrates connections between terminals and conductive planes of the FIG. 6A device according to some embodiments.
Figure 6A:
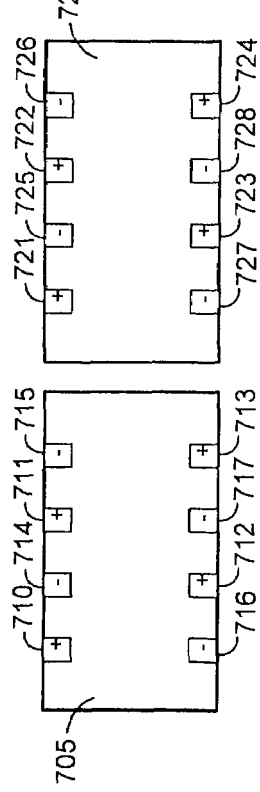
FIG. 6A includes a representation of terminals extending from an upper surface and terminals extending from a lower surface of a device according to some embodiments.

FIG. 6A includes representations of a device according to some embodiments. Device 700 may comprise one or more individual capacitors according to some embodiments. In contrast to device 600, upper surface 705 of device 700 consists of package material and terminals 710 through 717. Terminals 710 through 713 are associated with a first polarity (positive), and terminals 714 through 717 are associated with a second polarity (negative). Lower surface 720 includes the package material as well as terminals 721 through 728. Terminals 721 through 724 are associated with the first polarity, while terminals 725 through 728 are associated with the second polarity. The presence of terminals on surface 705 and surface 720 may facilitate manufacture and/or use of device 700.

FIG. 6B is a side cutaway representation of device 700 according to some embodiments. Terminals 727, 723, 728 and 724 are coupled to conductive planes in an arrangement similar to terminals 617, 613, 618 and 614 of FIG. 5B. Additionally, terminal 716 is coupled to each of conductive planes 720 through 727 and terminal 717 is coupled to conductive planes 725 through 727. Terminal 713 is coupled to each of conductive planes 730 through 737 and terminal 712 is coupled to conductive planes 735 through 737.

Terminals 727, 723, 728 and 724 are configured similarly to terminals 617, 613, 618 and 614 of device 600 and therefore operate as described above. Terminals 716, 712, 717, and 713 also operate similarly to terminals 617, 613, 618 and 614 of device 600. More particularly, a first capacitance is present between terminal 716 and 712, a second capacitance is present between terminals 717 and 713, and a sum of the first capacitance and the second capacitance is substantially equal to the capacitance between terminals 713 and 716.

Figure 6C:
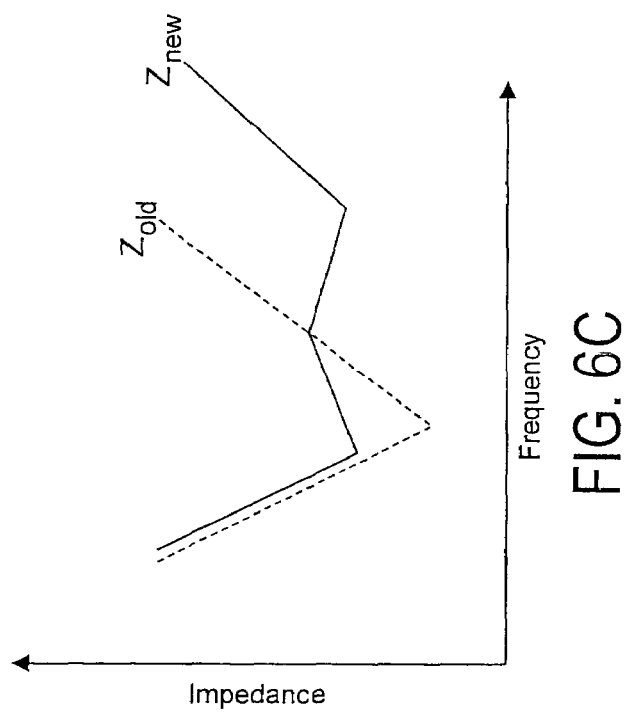
FIG. 6C is a graphical comparison of impedance profiles for the FIG. 6A device and for a conventional device according to some embodiments.

FIG. 6C is a graphical comparison of impedance profiles for device 700 and for a conventional device according to some embodiments. The impedance profile for device 700 is similar to that illustrated in FIG. 5C for device 600, since terminals of each surface of device 700 are configured similarly to the terminals of device 600.

FIG. 7A includes representations of a device according to some embodiments. Device 800 is similar to device 600 in that no terminals are present on upper surface 805. Moreover, lower surface 810 includes terminals 811 through 814 associated with a first polarity (positive), and terminals 815 through 818 associated with a second polarity (negative).

The side cutaway representation of device 800 shown in FIG. 7B is also similar to device 600. However, terminal 818 is coupled to more conductive planes than terminal 813. As a result, a first capacitance is present between terminal 817 and 813, a second capacitance is present between terminals 813 and 818, and third capacitance is present between terminals 817 and 814. The three different capacitances may result in an impedance profile such as that illustrated in FIG. 7C. The impedance profile may be flatter than that provided by embodiments such as device 600 and 700 because of the additional impedance power droop resulting from the third capacitance.

FIG. 8A includes representations of a device according to some embodiments. Device 900 is similar to device 700 in that terminals are located both on upper surface 905 and on lower surface 910. As shown in FIG. 8B, device 900 is unlike device 700 in that terminals 913 and 922 are connected to a different number of conductive planes. However, terminals 913 and 927 are connected to an equal number of conductive planes.

By virtue of the foregoing arrangement, terminals on each surface of device 900 provide three different capacitances. The capacitances may be similar to the three capacitances present at the terminals of device 800. Accordingly, the impedance profile of device 900 shown in FIG. 8C is similar to the impedance profile of FIG. 7C.

FIG. 9A is a representation of terminals extending from a surface of device 1000 according to some embodiments. Device 1000 may provide a plurality of capacitances. In particular, a first capacitance may appear between terminals 1001 and 1002, while a second capacitance may appear between any one of terminals 1004, 1006, and 1007 and any one of terminals 1003, 1005, and 1008.

FIG. 9B illustrates conductive planes of device 1000 according to some embodiments. Conductive plane 1010 includes portion 1011 and portion 1013, which are discontinuous from one another. Conductive plane 1010 may be associated with a first polarity. In this regard, conductive plane 1010 defines interfaces 1012, 1014, 1016, and 1018 for coupling conductive plane 1010 to terminals 1001, 1003, 1005, and 1008, which are also associated with the first polarity.

Conductive plane 1020 includes discontinuous portions 1021 and 1023. Conductive plane 1020 may be associated with a second polarity and may include interfaces 1022, 1024, 1026, and 1028 for coupling conductive plane 1020 to terminals that are also associated with the second polarity. Such terminals according to the illustrated embodiments are terminals 1002, 1004, 1006, and 1007.

Device 1000 may be constructed by placing alternating layers of conductive plane 1010 and conductive plane 1020 on top of one another. The layers may be separated by a dielectric. In some embodiments, a dielectric is disposed between portion 1011 and portion 1021 and the same or a separate dielectric is disposed between portion 1013 and portion 1023.

FIG. 9C shows an impedance profile of device 1000 according to some embodiments. The impedance profile is flatter than an impedance profile of existing systems because of the additional impedance droop provided by the additional capacitor of device 1000.

Figure 10B:
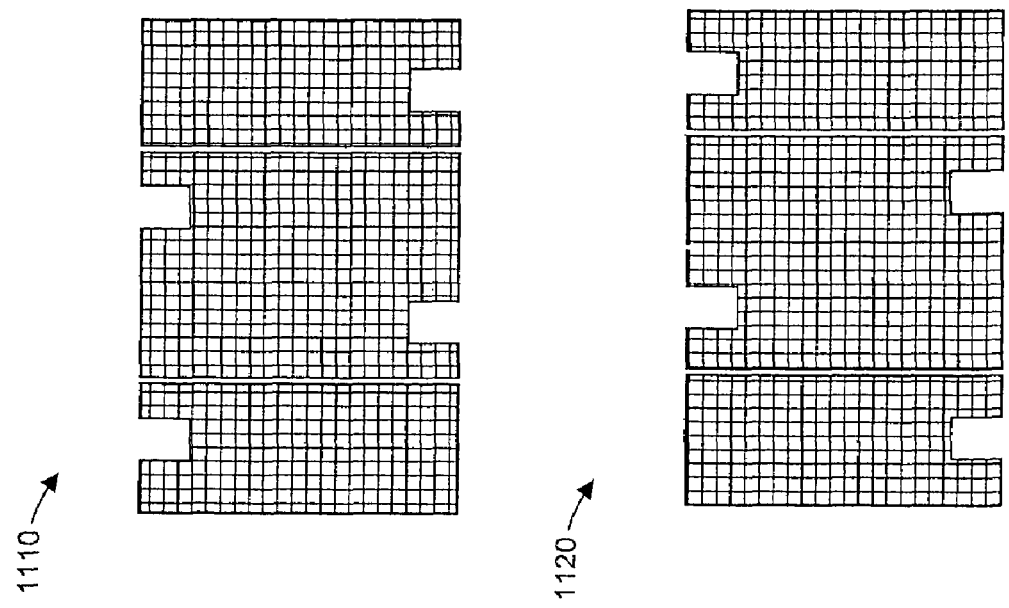
FIG. 10B illustrates conductive planes of the FIG. 10A device according to some embodiments.
Figure 10A:
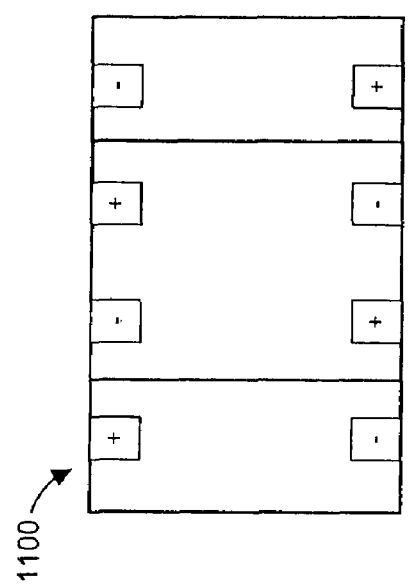
FIG. 10A includes a representation of terminals extending from a surface of a device according to some embodiments.
Figure 11B:
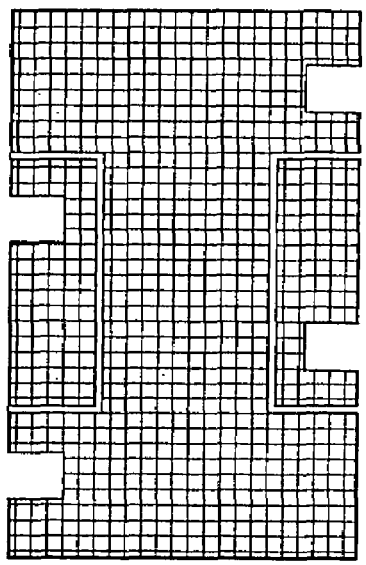
FIG. 11B illustrates conductive planes of the FIG. 11A device according to some embodiments.
Figure 11B:
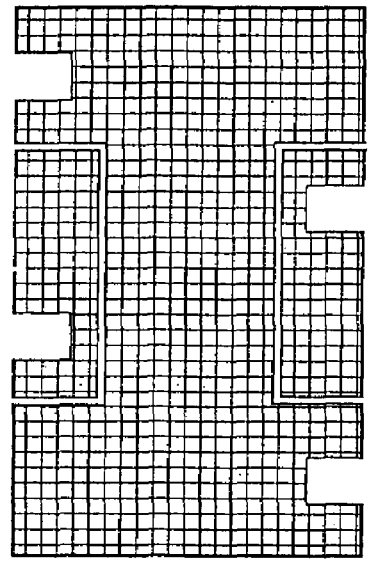
Figure 11A:
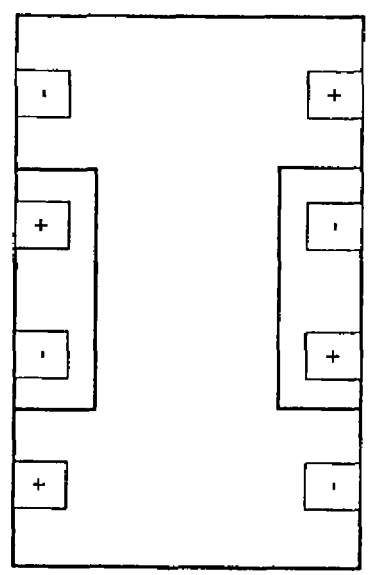
FIG. 11A includes a representation of terminals extending from a surface of a device according to some embodiments.
Figure 12B:
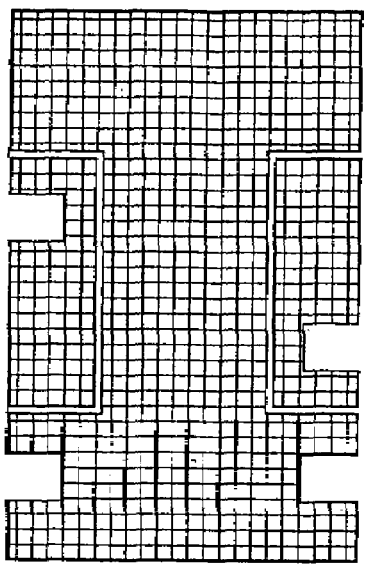
FIG. 12B illustrates conductive planes of the FIG. 12A device according to some embodiments.
Figure 12B:
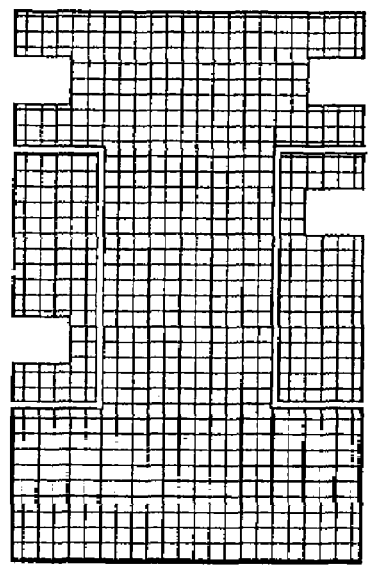
Figure 12A:
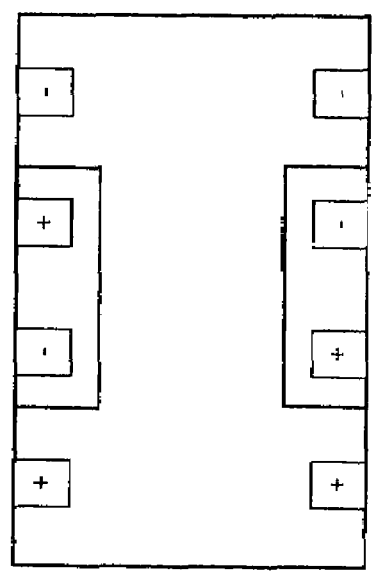
FIG. 12A includes a representation of terminals extending from a surface of a device according to some embodiments.

FIG. 10A illustrates device 1100 according to some embodiments. Device 1100 provides three capacitances. As shown in FIG. 10B, conductive planes 1110 and 1120 of device 1100 appear similar to conductive planes 1010 and 1020 of device 1000, but conductive planes 1110 and 1120 are split into three discontinuous portions. Each of planes 1110 and 1120 is associated with a different polarity, and each portion of a plane includes interfaces for coupling terminals that are associated with the polarity of the plane. Device 1100 may be constructed similarly to device 1000. Device 1100 may provide an impedance profile that is flatter than the impedance profile of device 1000 due to an additional impedance droop provided by the additional capacitor of device 1100.

FIGS. 11A through 12B each illustrate a different device providing multiple capacitances. Each device comprises a first conductive plane including three discontinuous portions, a second conductive plane including three discontinuous portions, and a dielectric disposed between at least one portion of the first conductive plane and at least one portion of the second conductive plane. Each conductive plane also defines interfaces for coupling terminals that are associated with a polarity of the conductive plane.

Figure 13:
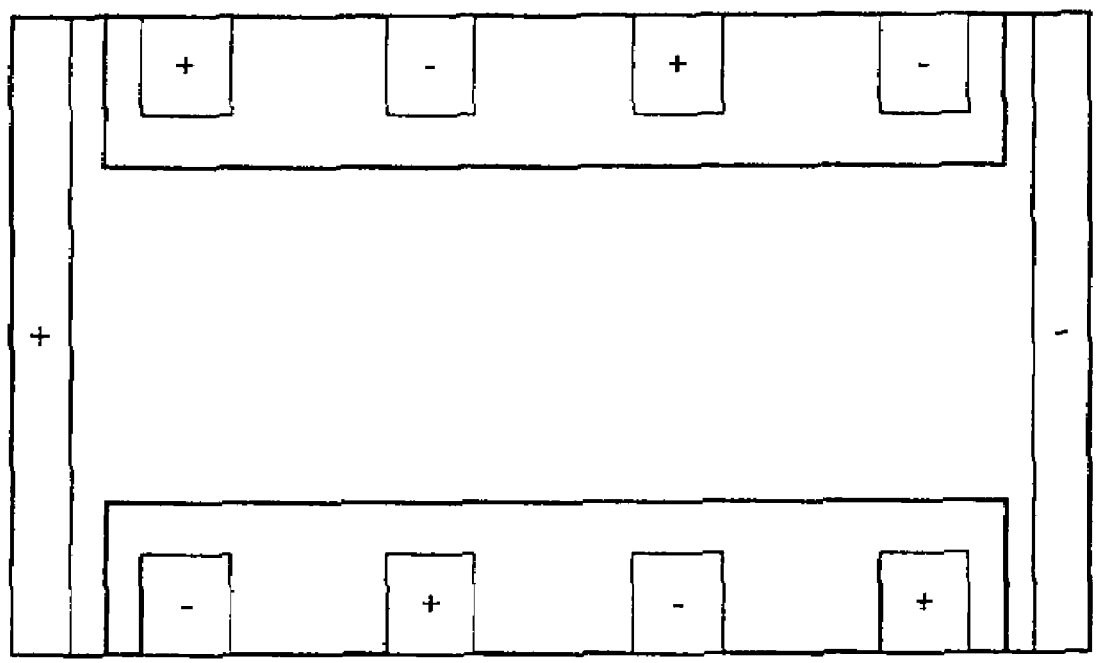
FIG. 13 includes a representation of terminals extending from a surface of a device according to some embodiments.
Figure 14:
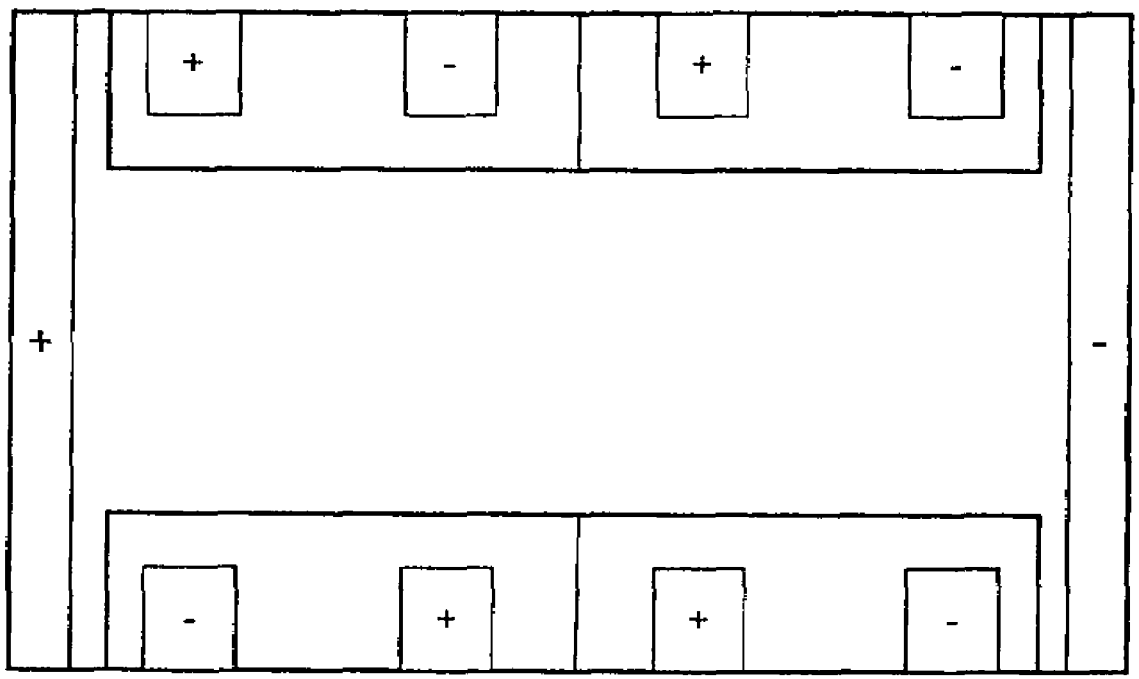
FIG. 14 includes a representation of terminals extending from a surface of a device according to some embodiments.
Figure 15:
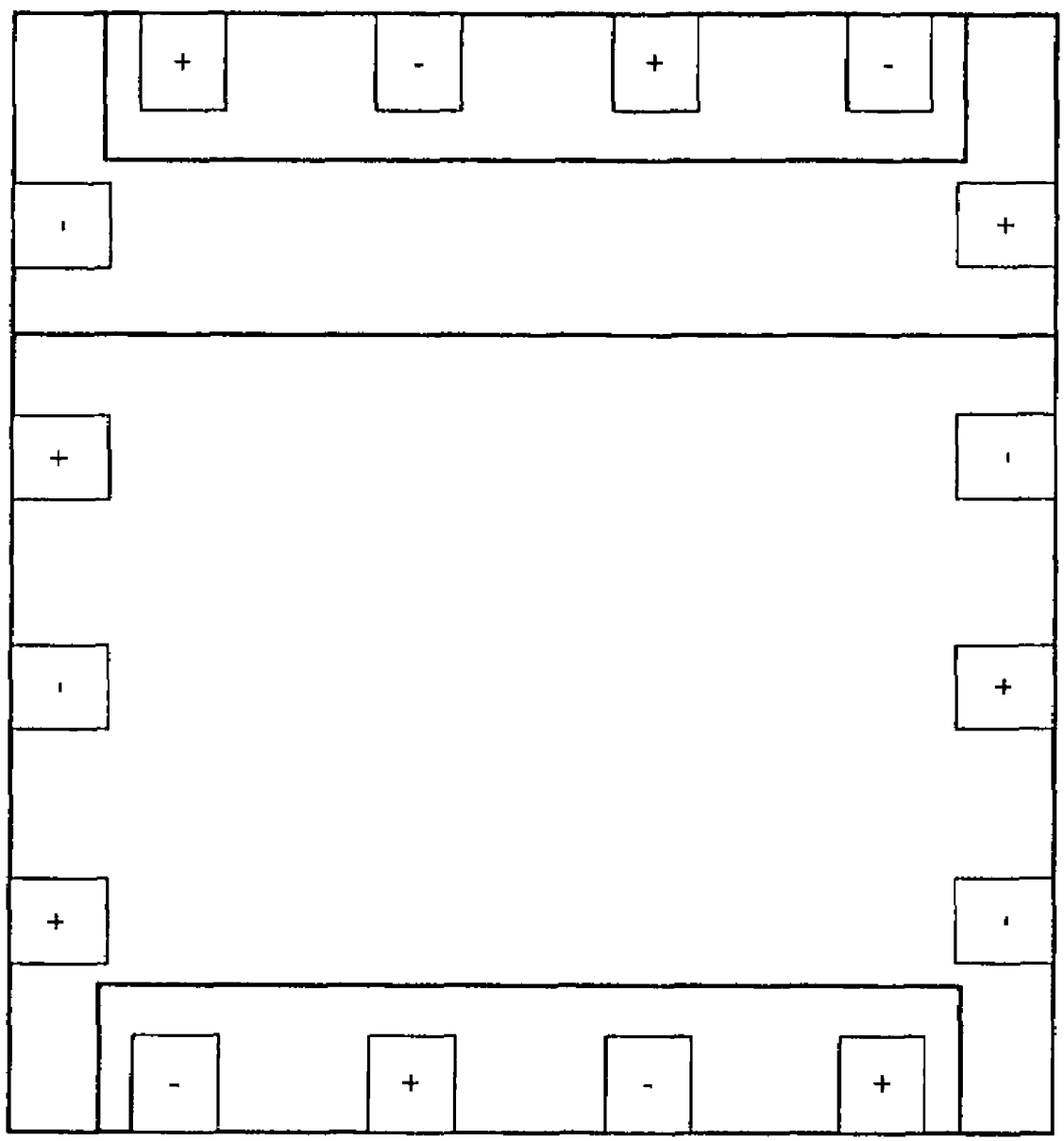
FIG. 15 includes a representation of terminals extending from a surface of a device according to some embodiments.

FIGS. 13 through 15 also illustrate devices providing multiple capacitances. The devices include more than eight terminals. However, each device includes at least a first conductive plane including at least two discontinuous portions, a second conductive plane including at least two discontinuous portions, and a dielectric disposed between at least one portion of the first conductive plane and at least one portion of the second conductive plane. Moreover, each conductive plane defines interfaces to which terminals that are associated with a polarity of the conductive plane may be coupled.

Each of the embodiments described above and illustrated herein may provide a more uniform impedance profile than a conventional device. The existence of fewer terminals per individual capacitance also may increase the equivalent series resistance of the total capacitance. These factors may reduce resonance between a motherboard and a package on which a device according to some embodiments is mounted.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A device comprising:
a first conductive plane electrically coupled to a first terminal associated with a first polarity and a second terminal associated with the first polarity;
a second conductive plane electrically coupled to a third terminal associated with a second polarity;
a dielectric disposed between the first conductive plane and the second conductive plane;
a third conductive plane electrically coupled to the second terminal and not electrically coupled to the first terminal; and
a second dielectric disposed between the second conductive plane and the third conductive plane, wherein a first capacitance is present between the first terminal and the third terminal,
wherein a second capacitance is present between the second terminal and the third terminal, and
wherein the first capacitance and the second capacitance are substantially dissimilar.

2. A device according to claim 1, wherein the second conductive plane is electrically coupled to a fourth terminal associated with the second polarity,
wherein a third capacitance is present between the first terminal and the fourth terminal,
wherein a fourth capacitance is present between the second terminal and the fourth terminal, and
wherein the third capacitance and the fourth capacitance are substantially dissimilar.

3. A device comprising:
a first n conductive planes, wherein n>1;
a second n conductive planes, each of the second n conductive planes separated from at least one of the first n conductive planes by a dielectric material;
a first terminal electrically coupled to w of the first n conductive planes, wherein $1<w<n+1$; and
a second terminal electrically coupled to x of the second n conductive planes, wherein $0<x<w$.

4. A device according to claim 3, further comprising:
a third terminal electrically coupled to y of the first n conductive planes, wherein $0<y<w$; and
a fourth terminal electrically coupled to z of the second n conductive planes, wherein $x<z<n+1$.

5. A device according to claim 4, wherein w=z and x=y.

6. A device according to claim 4, wherein w=z and x<y.

7. A device according to claim 4, further comprising:
a package, the first terminal, the second terminal, the third terminal and the fourth terminal extending from a lower surface of the package;
a fifth terminal electrically coupled to the w first conductive planes;
a sixth terminal electrically coupled to the z second conductive planes;
a seventh terminal electrically coupled to y of the first conductive planes, the planes electrically coupled to the seventh terminal being different from the planes electrically coupled to the third terminal; and
a eighth terminal electrically coupled to x of the second conductive planes, the planes electrically coupled to the eighth terminal being different from the planes electrically coupled to the second terminal,
wherein the fifth terminal, the sixth terminal, the seventh terminal and the eighth terminal extend from an upper surface of the package.

8. A device according to claim 4, further comprising:
a package, the first terminal, the second terminal, the third terminal and the fourth terminal extending from a lower surface of the package;
a fifth terminal electrically coupled to the w first conductive planes;
a sixth terminal electrically coupled to the z second conductive planes;
a seventh terminal electrically coupled to x of the first conductive planes, the planes electrically coupled to the seventh terminal being different from the planes electrically coupled to the third terminal; and
a eighth terminal electrically coupled to y of the second conductive planes, the planes electrically coupled to the eighth terminal being different from the planes electrically coupled to the second terminal,
wherein the fifth terminal, the sixth terminal, the seventh terminal and the eighth terminal extend from an upper surface of the package.

9. A device according to claim 4, further comprising:
a package, the first terminal, the second terminal, the third terminal and the fourth terminal extending from a lower surface of the package;
a fifth terminal electrically coupled to the w first conductive planes;
a sixth terminal electrically coupled to the z second conductive planes;
a seventh terminal electrically coupled to the y first conductive planes; and
a eighth terminal electrically coupled to the x second conductive planes,
wherein the fifth terminal, the sixth terminal, the seventh terminal and the eighth terminal extend from an upper surface of the package.

10. A device comprising:
a first conductive plane, the first conductive plane comprising a first portion and a second portion, the first portion discontinuous from the second portion;
a second conductive plane, the second conductive plane comprising a third portion and a fourth portion, the third portion discontinuous from the fourth portion; and
a dielectric disposed between the first portion of the first conductive plane and the third portion of the second conductive plane.

11. A device according to claim 10, the dielectric disposed between the second portion of the first conductive plane and the fourth portion of the second conductive plane.

12. A device according to claim 10, further comprising:
a second dielectric disposed between the second portion of the first conductive plane and the fourth portion of the second conductive plane.

13. A device according to claim 10, wherein the first portion of the first conductive plane defines a first interface to couple the first portion to a first terminal associated with a first polarity, and
wherein the third portion of the second conductive plane defines a second interface to couple the third portion to a second terminal associated with a second polarity.

14. A device according to claim 13, wherein the second portion of the first conductive plane defines a third interface to couple the second portion to a third terminal associated with the first polarity, and
wherein the fourth portion of the second conductive plane defines a fourth interface to couple the fourth portion to a fourth terminal associated with the second polarity.

15. A device according to claim 13, wherein the first portion of the first conductive plane defines a third interface to couple the first portion to a third terminal associated with the first polarity, and
   wherein the third portion of the second conductive plane defines a fourth interface to couple the third portion to a fourth terminal associated with the second polarity.

16. A system comprising:
   a microprocessor;
   a package coupled to the microprocessor, the package comprising:
      a circuit element comprising a first conductive plane electrically coupled to a first terminal associated with a first polarity and a second terminal associated with the first polarity, a second conductive plane electrically coupled to a third terminal associated with a second polarity, and a dielectric disposed between the first conductive plane and the second conductive plane, a third conductive plane electrically coupled to the second terminal and not electrically coupled to the first terminal, and a second dielectric disposed between the second conductive plane and the third conductive plane; and
   a double data rate memory coupled to the package,
   wherein a first capacitance is present between the first terminal and the third terminal,
   wherein a second capacitance is present between the second terminal and the third terminal, and
   wherein the first capacitance and the second capacitance are substantially dissimilar.

17. A system according to claim 16, further comprising:
   a motherboard coupled to the package and to the double data rate memory, wherein the circuit element is to reduce resonance between the package and the motherboard.

* * * * *